(12) United States Patent
Kanschat et al.

(10) Patent No.: US 8,159,822 B2
(45) Date of Patent: Apr. 17, 2012

(54) POWER SEMICONDUCTOR MODULE FEATURING RESILIENTLY SUPPORTED SUBSTRATES AND METHOD FOR FABRICATING A POWER SEMICONDUCTOR MODULE

(75) Inventors: Peter Kanschat, Soest (DE); Olaf Hohlfeld, Warstein (DE); Thilo Stolze, Arnsberg (DE)

(73) Assignee: Infineon Technologies AG, Neubiberg (DE)

( * ) Notice: Subject to any disclaimer, the term of this patent is extended or adjusted under 35 U.S.C. 154(b) by 139 days.

(21) Appl. No.: 12/789,251

(22) Filed: May 27, 2010

(65) Prior Publication Data

US 2010/0302741 A1    Dec. 2, 2010

(51) Int. Cl.
*H05K 7/20* (2006.01)

(52) U.S. Cl. ........ 361/707; 361/704; 361/715; 361/719; 165/184

(58) Field of Classification Search .................. None
See application file for complete search history.

(56) References Cited

U.S. PATENT DOCUMENTS

| | | | |
|---|---|---|---|
| 6,787,900 B2 * | 9/2004 | Shinohara et al. | 257/718 |
| 6,791,183 B2 * | 9/2004 | Kanelis | 257/718 |
| 6,921,969 B2 * | 7/2005 | Knapp | 257/704 |
| 6,979,204 B2 | 12/2005 | Göbl et al. | |
| 7,450,389 B2 * | 11/2008 | Stolze et al. | 361/715 |
| 7,495,324 B2 * | 2/2009 | Popp et al. | 257/678 |
| 2004/0164388 A1 | 8/2004 | Stolze | |
| 2009/0021916 A1 | 1/2009 | Stolze | |
| 2009/0039498 A1 | 2/2009 | Bayerer | |
| 2010/0127371 A1 * | 5/2010 | Tschirbs | 257/684 |
| 2010/0252922 A1 * | 10/2010 | Bayerer et al. | 257/692 |

FOREIGN PATENT DOCUMENTS

| | | |
|---|---|---|
| DE | 3505086 A1 | 8/1986 |
| DE | 10142971 A1 | 3/2003 |
| DE | 10306643 B4 | 8/2004 |
| DE | 102008033465 A1 | 1/2009 |
| DE | 102008036112 A1 | 2/2009 |
| EP | 1263045 A1 | 12/2002 |

* cited by examiner

*Primary Examiner* — Boris Chervinsky
(74) *Attorney, Agent, or Firm* — Murphy, Bilak & Homiller, PLLC

(57) ABSTRACT

The invention relates to a power semiconductor module including a module housing and at least one substrate populated with at least one power semiconductor chip. The module housing has a bottom side and a top side spaced away from the bottom side in a positive vertical direction. In addition, the substrate has a bottom side facing away from an interior of the module housing. The substrate is arranged in an opening of the module housing configured in its bottom side and attached to the module housing by a resilient bonding agent for freedom of movement of the substrate parallel to the vertical direction in relation to the module housing. In the non-mounted condition of the power semiconductor module, the substrate assumes a resting position in relation to the module housing. To deflect the substrate from the resting position parallel to the vertical direction, a deflection force of 0.1 N to 100 N per mm is applied.

25 Claims, 9 Drawing Sheets

POWER SEMICONDUCTOR MODULE FEATURING RESILIENTLY SUPPORTED SUBSTRATES AND METHOD FOR FABRICATING A POWER SEMICONDUCTOR MODULE

PRIORITY CLAIM

This application claims priority to German Patent Application No. 10 2009 026 558.9-33 filed on 28 May 2009, the content of which is incorporated herein by reference in its entirety.

FIELD OF THE INVENTION

The present invention relates to power semiconductor modules in which one or more power semiconductor chips are arrayed on one or more substrates.

BACKGROUND

In accordance with a first alternative of such power semiconductor modules, the substrates can be mounted on a common metallic backplane forming the base plate of the module and via which the heat given off by the power semiconductor chip is dissipated by a heat sink.

In a second alternative of power semiconductor modules, there is no common metallic backplane for the substrates, the bottom side facing the outside of the module forming the bottom side of the module. In modules of this kind, the substrates are mounted in thermal contact with a heat sink without an interposed common backplane.

To optimize dissipation of the heat materializing in the power semiconductor chips mounted on the substrates, the thermal transition resistance between the substrate and the heat sink needs to be as even as possible, this in turn necessitating a force urging the substrate into contact with the heat sink mounting the power semiconductor module.

In conventional power semiconductor modules, this contact pressure force is significantly determined by the force with which the power semiconductor module as a whole is urged against the heat sink, for example by screw fastening.

However, this latter force is generally much higher than the force needed to bring the substrates into contact with the heat sink. It is particularly when the substrates are engineered as metalized ceramic platelets that there is then a risk of the ceramic platelet becoming fractured by an excessive contact pressure.

Hence, there is a need to provide a power semiconductor module fixably bonded to a heat sink and comprising a substrate experiencing, by being mounted on the heat sink, a force urging it in the direction of the heat sink but which is substantially independent of the contact pressure force with which the power semiconductor module is urged against the heat sink.

A further need is to define a method for fabricating such a power semiconductor module.

SUMMARY

The heat sink mountable power semiconductor module as detailed hereinafter comprises a module housing and at least one flat substrate populated with at least one power semiconductor chip according to an embodiment. The module housing comprises a bottom side and a top side spaced away from the bottom side in a positive vertical direction. In addition, the substrate features a bottom side facing away from an interior of the module housing. The substrate is arranged in an opening of the module housing configured in its bottom side and attached to the module housing by means of a resilient bond for freedom of movement parallel to the vertical direction in relation to the module housing. In the non-mounted condition of the power semiconductor module, i.e., when not mounted on a heat sink or on some other object, the substrate assumes a resting position in relation to the module housing. To deflect the substrate from the resting position parallel to the vertical direction in and/or contrary to the vertical direction, a deflection force of just 0.1 N to 100 N per mm or of 0.1 N to 10 N per mm is applied. This range as cited applies at least for small deflections of, for example, up to 0.5 mm from the resting position.

This results in the mechanical coupling between the substrate and the module housing being much weaker than on conventional power semiconductor modules. Suitable as a bond in this case is, for example, an adhesive nesting the substrate in closing off a gap having formed between the edge of the substrate and the module housing. In this arrangement, the thickness of the coupling can be set by the width of the gap.

It is particularly in the case of a highly pliant coupling that the resting position of the substrate can be influenced by its deadweight and thus the spatial orientation of the power semiconductor module, it being understood that a resting position in the sense of the present invention is deemed to be basically any resting position of the substrate resulting from any spatial orientation of the power semiconductor module.

But especially at least the position of the substrate in relation to the module housing is deemed the resting position resulting when the power semiconductor module is spatially arranged so that the vertical direction and the direction of gravity (directed at the center of the earth) are opposingly directed. In other words, this is the position as materializes when the bottom side of the module housing is directed downwards in colloquial parlance.

In accordance with a first variant, the bottom side of the substrate in the resting position thereof may be spaced away from the bottom side of the module housing in the negative vertical direction, i.e., the substrate is (slightly) elevated as to the bottom side of the module housing or, in other words, the substrate is displaced in a direction away from the interior of the module housing when the bottom sides of the module housing and of the substrate are coplanar.

In accordance with a second variant, the bottom side of the substrate in the resting position thereof may be spaced away from the bottom side of the module housing in the positive vertical direction, i.e., the substrate is (slightly) sunk as to the bottom side of the module housing, or in other words, the substrate is displaced in a direction together with the interior of the module housing when the bottom sides of the module housing and of the substrate are coplanar.

In accordance with a third variant, the bottom side of the substrate in the resting position thereof is coplanar to the bottom side of the module housing.

In each of these three variants, there may be additionally a contact pressure device provided generating a contact pressure force by means of which the substrate is urged in the direction of the surface of the heat sink when the power semiconductor module is attached to a heat sink for its cooling. The contact pressure acting on the substrate may be generated by the contact pressure device acting directly on the substrate and/or via a power semiconductor chip mounted on the substrate and/or via a bond wire bonded directly or indirectly to the substrate. In the case of a contact pressure device acting on a bond wire the contact pressure device may act, e.g., on the bond, or, e.g., at the position of a bond loop disposed between two adjacent bonds at which the bond location is spaced furthest away from the top side of the substrate.

To fabricate such a power semiconductor module, a module housing is provided comprising a bottom side and a top side spaced away from the bottom side in a positive vertical direction. Configured at the bottom side of the module housing is an opening for receiving a substrate. Further provided is a substrate with a bottom side and a top side populated with at least one power semiconductor chip. The substrate is positioned in the region of the opening so that its top side faces the interior of the module housing and is spaced away from the module housing in each lateral direction perpendicular to the vertical direction, resulting in a gap surrounding the substrate between the module housing and the substrate which is then sealed by means of a resilient bonding agent.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

Figure 1A:
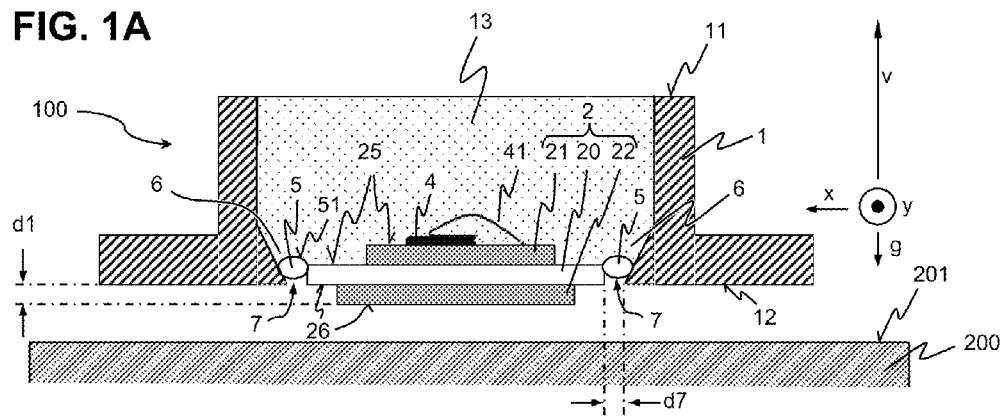
FIG. 1A is a vertical section through a power semiconductor module mountable on a heat sink featuring a substrate resiliently supported vertically in its resting position in which the bottom side of the substrate is elevated in relation to the bottom side of the module housing in accordance with a first variant.

In the following Detailed Description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In the figures, unless stated otherwise, like or corresponding elements having like or corresponding functions are identified by like reference numerals.

DETAILED DESCRIPTION

Referring now to FIG. 1A, there is illustrated a vertical section through a power semiconductor module 100 shown unmounted, i.e., before being mounted to a heat sink or some other object in press contact for cooling by placement on a contact flat 201 of a heat sink 200 to produce a thermal contact between the contact flat 201 and the bottom side 26 of a substrate 2.

The power semiconductor module 100 comprises a module housing 1 featuring a top side 11 as well as a bottom side 12 spaced away from the top side 11 in a vertical direction v. In the assembly as shown in FIG. 1A, the module housing 1 is yet to be mounted on the heat sink 200, this being the reason why the bottom side 12 is illustrated spaced away from the contact flat 201 of the heat sink 200.

The power semiconductor module 100 features furthermore a substrate 2 comprising a dielectric 20 topped by a top metallization 21 facing the interior of the module housing 1 and bottomed by an optional bottom metallization 22 facing away from the interior of the module housing 1.

The dielectric 20 may be, for example, a ceramic such as, e.g., an aluminum oxide, silicon nitride or aluminum nitride ceramic whilst the substrate 2 may be configured, for example, as a direct copper bonding (DCB), direct aluminum bonding (DAB) or active metal brazing (AMB) substrate.

Sited on the top metallization 21 is a power semiconductor chip 4 bonded with the aid of the top metallization 21 and by means of bond wires 41 to electric components (not shown) of the power semiconductor module 100, for example, to contact tabs and/or to other power semiconductor chips. To realize a circuited assembly, the top metallization 21 may be patterned, according to the requirements of the respective application, into conducting tracks and/or pads.

Figure 1B:
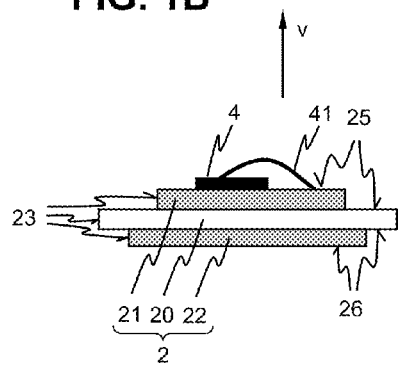
FIG. 1B is a vertical section through a substrate populated with a power semiconductor chip as employed in the power semiconductor module as shown in FIG. 1A.

Referring now to FIG. 1B, there is illustrated separately how the substrate 2 populated with the power semiconductor chip 4 comprises a top side 25 facing the interior of the module housing 1 as well as a bottom side 26 facing away from the interior of the module housing 1. Perpendicular to the vertical direction v oriented perpendicular to the top side 25 and bottom side 26 of the substrate 2, the substrate 2 includes a lateral surface 23 forming a closed ring enclosing the substrate 2 on all sides.

Referring again to FIG. 1A, there is illustrated how a populated substrate 2 is inserted in a bottom opening of the module housing 1 and resiliently coupled to the module housing 1 by means of a resilient bonding agent 5 surrounding the substrate 2 as a closed ring in each lateral direction x, y perpendicular to the vertical direction v. For freedom of movement of the substrate 2 in relation to the module housing 1 at least in the vertical direction v, there is provided on the top side 51 of the resilient bonding agent 5, as given by the side thereof facing away from the bottom side 12 in the vertical direction v, a portion 6 configured as a closed ring extending along the top side 51 of the resilient bonding agent 5 and in which the resilient bonding agent 5 is spaced away from the module housing 1 in the vertical direction v.

This is how it is assured that the freedom of movement of the resilient bonding agent 5 is not significantly restricted by the module housing 1 when the power semiconductor module 100 is pressed into contact with the heat sink 200 due to the module housing 1 at least in the vertical direction v. As evident from FIG. 1A, the power semiconductor module 100 is oriented so that its bottom side 12 and bottom side 26 of the substrate 2 are directed downwards, i.e., in the direction g of the force of gravity to which in this case the vertical direction v runs contrary.

To enhance its dielectric strength, the interior of the module housing 1 can be potted with a pliant potting compound 13, for example a gel, e.g., a silicone gel, from the top side 25 of the module housing 1 up to at least the level of the power semiconductor chip 4. The pliant potting compound 13 may be formulated with a very low viscosity so that it does not prove a nuisance when the pliant potting compound 13 even extends up to the top side 51 of the resilient bonding agent 5, since the pliant potting compound 13 easily conforms without any significant effort when the power semiconductor module 100 is pressed into contact with the heat sink 200 due to the substrate 2 being shifted in relation to the module housing 1 in the vertical direction v and the resilient bonding agent 5 included in the movement thereof so that, in actual practice there is no relevant obstruction to the freedom of movement of the substrate 2 in relation to the module housing 1.

Referring still to FIG. 1A, there is illustrated the substrate 2 in a possible resting position in which the bottom side 26 of the substrate 2 overhangs the bottom side 12 of the module housing 1 by a distance d1 contrary to the vertical direction v. This distance d1 may range, for example, from more than 0 to 1 mm or more than 0 to 0.5 mm.

Where d1=0 mm, the assembly is in accordance with the third variant in which the bottom side 26 of the substrate 2 and the bottom side 12 of the module housing 1 are coplanar.

The opening in the bottom side 12 of the module housing 1 into which the substrate 2 is inserted is oversized in each lateral direction x, y perpendicular to the vertical direction v in relation to the lateral dimensions of the substrate 2 in the corresponding lateral direction x, y to create a gap 7 between the substrate 2 and the module housing 1 having (as measured perpendicular to the vertical direction v and in the resting position) a minimum width d7 ranging, for example, from 0.1 to 2 mm or from 0.1 to 1 mm which is sealed by the resilient bonding agent 5 to prevent the interior of the module housing 1 from become soiled as well as to prevent weeping of the pliant potting compound 13 optionally potting the interior of the module housing 1.

Figure 1C:
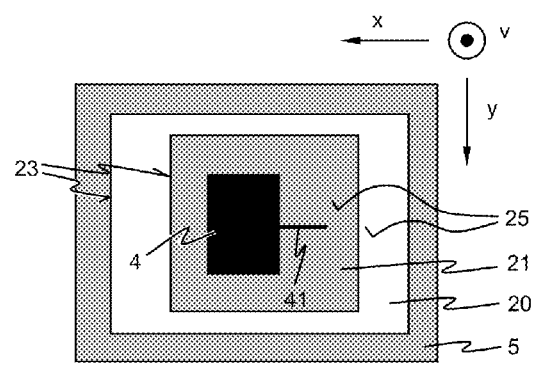
FIG. 1C is a top-down view of the substrate populated with the power semiconductor chip and the resilient bonding agent enclosing the substrate on all sides in the power semiconductor module as shown in FIG. 1A.

Referring now to FIG. 1C, there is illustrated a top-down view of the populated substrate 2 as shown in FIGS. 1A and 1B including the resilient bonding agent 5 as shown in FIG. 1A enclosing the substrate 2 on all sides.

To deflect the substrate 2 in and/or contrary to the vertical direction v from its resting position as shown in FIG. 1A, a deflection force ranging from 0.1 to 100 N may be required per mm deflection. In testing the resilient bonding agent 5 configured as a bead of adhesive, a force of approx 40 N per mm deflection of the substrate 2 was detected in and/or contrary to the vertical direction v as necessary for an adhesive bead roughly 100 mm long (corresponding substantially to the circumference of the substrate 2 on all sides) and a width d7 of the gap 7 amounting to roughly 0.2 mm. The adhesive employed was Semicosil® made by Wacker Chemie AG.

Figure 1D:
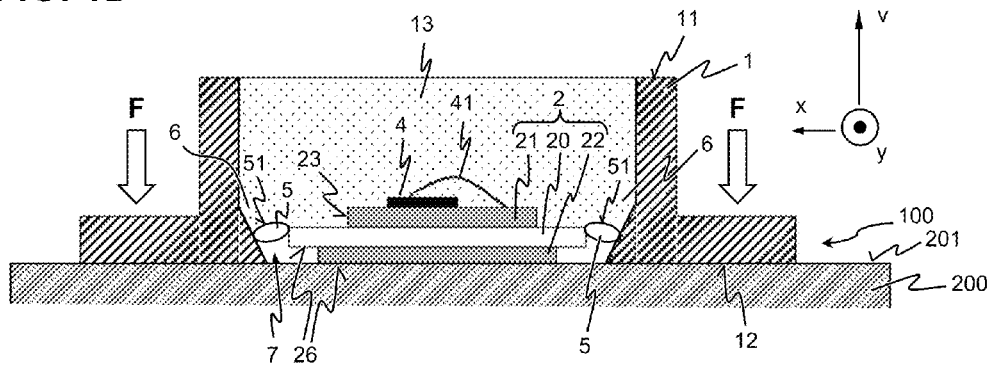
FIG. 1D is a view of the power semiconductor module as shown in FIG. 1A after being mounted on a heat sink.

Referring now to FIG. 1D, there is illustrated a vertical section through the assembly as shown in FIG. 1A after the power semiconductor module 100 has been mounted on the contact flat 201 of the heat sink 200, the contact pressure force F needed for this purpose being indicated by the arrow symbols in FIG. 1D. This contact pressure force F may be created, for example, by screws (not shown) for screwing the power semiconductor module 100 to the heat sink 200, instead of which, or in addition thereto, of course, any other suitable fasteners such as, e.g., clips, locking hooks and the like may be employed.

Pressing the power semiconductor module 100 into contact with the heat sink 200 urges the substrate 2 in the direction of the inner side of the module housing 1 elastically deforming the resilient bonding agent 5, as a result of which the resilient bonding agent 5 is biased in pressing the substrate 2 by its lateral surface 23 evenly in the direction of the heat sink 200. The force needed for this purpose is determined particularly by the geometry and material of the resilient bonding agent 5 and decoupled, as far as possible, from the contact pressure force F with which the power semiconductor module 100 is urged against the heat sink 200 in thus making sure that the substrate 2 is not ruined should the power semiconductor module 100 be inadvertently mounted on the contact flat 201 with an excessive contact pressure force F.

The resilient bonding agent 5 may be, for example, a bead, e.g., of a silicone-based adhesive attaining a cured Shore A hardness ranging from 10 to 40, for example, roughly 35, for instance.

Figure 2:
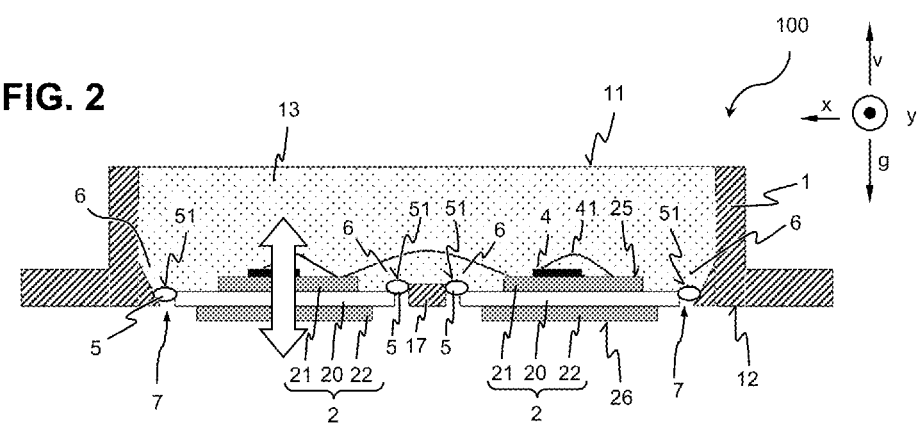
FIG. 2 is a vertical section through a power semiconductor module featuring two substrates spaced away from each other in their resting positions, each of which is bonded by means of a resilient bonding agent enclosing the substrate on all sides in a concavity at the bottom side of the module housing in accordance with a first variant.

Referring now to FIG. 2, there is illustrated a vertical section through a power semiconductor module 100 including two substrates 2 spaced away from each other in their resting positions, each of which is populated with a power semiconductor chip 4 and bonded to the module housing 1 of the power semiconductor module 100 by means of a resilient bonding agent 5 configured ring-shaped nesting each substrate 2 on all sides.

At its bottom side 12, the module housing 1 features a web 17 through which two openings spaced away from each other are provided at the bottom side 12 of the module housing 1, in each of which one of the substrates 2 is inserted and resiliently bonded to the module housing 1 by the resilient bonding agent 5. It is understood that correspondingly more than two substrates may be inserted in a corresponding number of openings in the bottom side 12 and each bonded to the module housing 1 by a resilient bonding agent 5.

In the power semiconductor module 100 as shown in FIG. 2, a portion 6 configured as a closed ring is provided at the top side 51 of the resilient bonding agent 5 of each of the substrate 2, this portion 6 directly adjoining the top side 51 which is free of portions of the module housing 1 in surrounding the corresponding substrate 2 on all sides.

Figure 3:
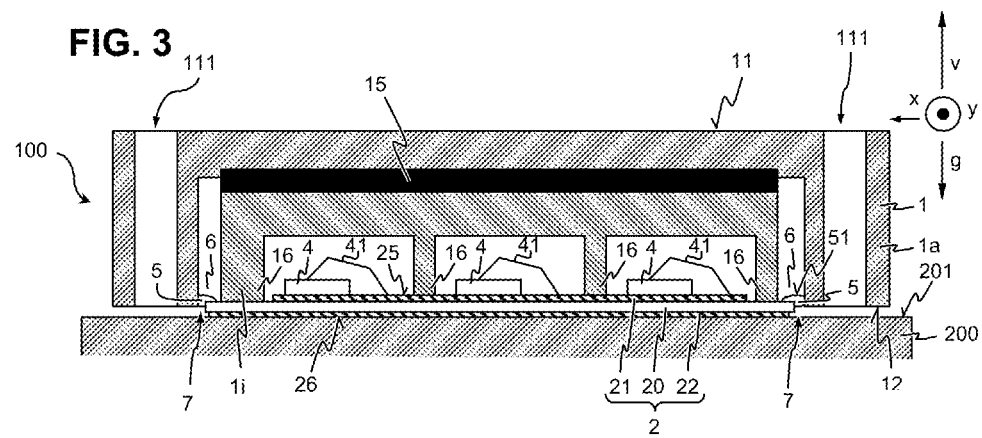
FIG. 3 is a vertical section through a power semiconductor module in accordance with a first variant featuring a substrate resiliently bonded to the module housing by means of a resilient bonding agent applied on all sides, the module housing comprising an inner module housing resiliently coupled to the opening by means of a pressure pad urging the substrate into contact with the heat sink when mounting the power semiconductor module to a heat sink.

Referring now to FIG. 3, there is illustrated a vertical section through an assembly including a power semiconductor module 100 sited on a contact flat 201 of a heat sink 200 but yet to be bonded thereto.

The power semiconductor module 100 comprises a substrate 2 which may be structured like the substrate 2 as explained above, its top metallization 21 mounting several power semiconductor chips 4 electrically connected by means of bond wires 41 as well as by means of the top metallization 21. The substrate 2—like the substrate 2 as already explained with reference to the previous FIGS. 1A to 1D and FIG. 2—is resilient bonded by means of a resilient bonding agent 5 to the module housing 1 for freedom of movement parallel to the vertical direction v.

Arranged at the top side 51 of the resilient bonding agent 5 facing away from the bottom side 12 in the vertical direction v is a portion 6 configured as a closed ring extending along the top side 51 of the resilient bonding agent 5 and surrounding the substrate 2. This portion 6 directly adjoining the top side 51 is free from portions of the module housing 1, allowing for freedom of movement of the substrate 2 in the vertical direction v in relation to the module housing 1.

The module housing 1 comprises a first part 1a forming an outer module housing, as well as a part 1i forming a contact pressure device disposed between a cover of the outer module housing 1a and the substrate 2 and which may be optional fixedly bonded to the substrate 2. Disposed between the outer module housing 1a and the contact pressure device 1i spaced away from the outer module housing 1a in the negative vertical direction v is a pressure pad 15 which may be made of a foamed plastics material, for example.

The pressure pad 15 provides for a resilient coupling between the outer module housing 1a and the contact pressure device 1i. The contact pressure device 1i comprises a contact pressure element 16 configured as a pressure pad 15 exerting a contact pressure on the substrate 2 laterally alongside the power semiconductor chip 4 when suitable biased due to mounting the power semiconductor module 100 on the heat sink 200, resulting in the substrate 2 being urged in the direction of the contact flat 201 of the heat sink 200.

In addition or as an alternative thereto, contact pressure elements 16 may also be provided above the power semiconductor chip 4 so that the contact pressure emanating from the pressure pad 15 acts on the substrate 2 via the contact pressure device 1i and the power semiconductor chip 4. An even distribution of the contact pressure on the substrate 2 is achievable by arraying the contact pressure elements 16 adapted to the geometry of each substrate and its componenting.

In all, the contact pressure with which the substrate 2 is pressed against the heat sink 200 is dictated by the resiliency and geometry of the resilient bonding agent 5 and pressure pad 15. It is because of the resilient bonding agent 5 and pressure pad 15 that the contact pressure acting on the substrate 2 in the direction of the contact flat 201 of the heat sink 200 is practically decoupled from the contact pressure with which the module housing 1 of the power semiconductor module 100 is urged against the contact flat 201 of the heat sink 200.

To bond the power semiconductor module 100 to the heat sink 200, the module housing 1 is engineered with through-holes 111 through which fastener screws (not shown) can be threaded to screw the power semiconductor module 100 to the heat sink 200. The tappings needed for this in the heat sink 200 are not shown in FIG. 3.

Figure 4:
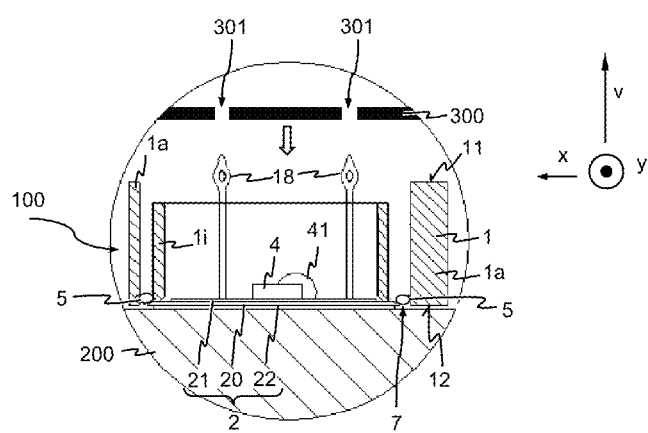
FIG. 4 is a vertical section through a portion of a power semiconductor module located on a heat sink, the module being topped by press-fit contacts which are pressed into corresponding holes of a printed circuit board to be electrically connected to the power semiconductor module in mounting the power semiconductor module on the heat sink.

Referring now to FIG. 4, there is illustrated a vertical section through a portion of a power semiconductor module 100 featuring a module housing 1 comprising an outer module housing 1a and an inner module housing 1i. The inner module housing 1i is fixedly bonded to the substrate 2 which may be structured the same as the substrate 2 already described and as shown in the previous FIGS. 1A to 1D, 2 and 3. Like the substrate 2 as shown in FIG. 3, the substrate 2 is bonded to the outer module housing 1a by a resilient bonding agent 5.

The power semiconductor module 100 comprises furthermore terminal contacts 18 structured as press-fit contacts electrically conductively contacting the substrate 2 and which in mounting the power semiconductor module 100 on the contact flat 201 of the heat sink 200 are pressed into holes 301 of a printed circuit board 300 to electrically conductively contact an electric circuit realized on the printed circuit board 300. As shown, the terminal contacts 18 may optionally function as contact pressure elements urging the substrate 2 in the direction of the contact flat 201 of the heat sink 200 when mounting the power semiconductor module 100.

Figure 5:
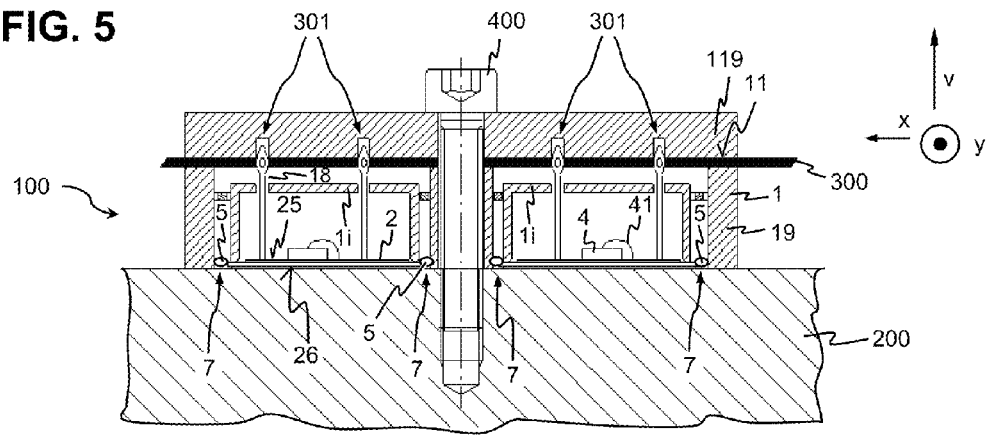
FIG. 5 is a vertical section through an assembly including the power semiconductor module as shown in FIG. 4 after being mounted on the heat sink.

Referring now to FIG. 5, there is illustrated a vertical section through the power semiconductor module 100 as shown in FIG. 4 after being mounted on the heat sink 200 by means of a fastener 400 configured, for example, as a screw extending in the vertical direction v through the power semiconductor module 100 and tapped into the heat sink 200. Screwing the fastener urges the outer module housing 1a into contact with the heat sink 200, biasing the resilient bonding agent 5, resulting in the substrate 2 being pressed into contact with the heat sink 200 as already explained above. Screwing the fastener 400 into the heat sink 200 urges the printed circuit board 300, interposed by a pusher 119, against the power semiconductor module 100 so that the terminal contacts 18 are pressed into the corresponding holes 301 of the printed circuit board 300, electrically bonding the substrate 2 to the printed circuit board 300. Optionally disposed between the inner module housing 1i and the pusher 119 is, for instance, a pressure pad (not shown) decoupling the force of the pressure emanating from the pusher 119 in relaying it via the inner module housing 1i to the substrate 2, so that the inner module housing 1i acts as a contact pressure device.

Figure 6A:
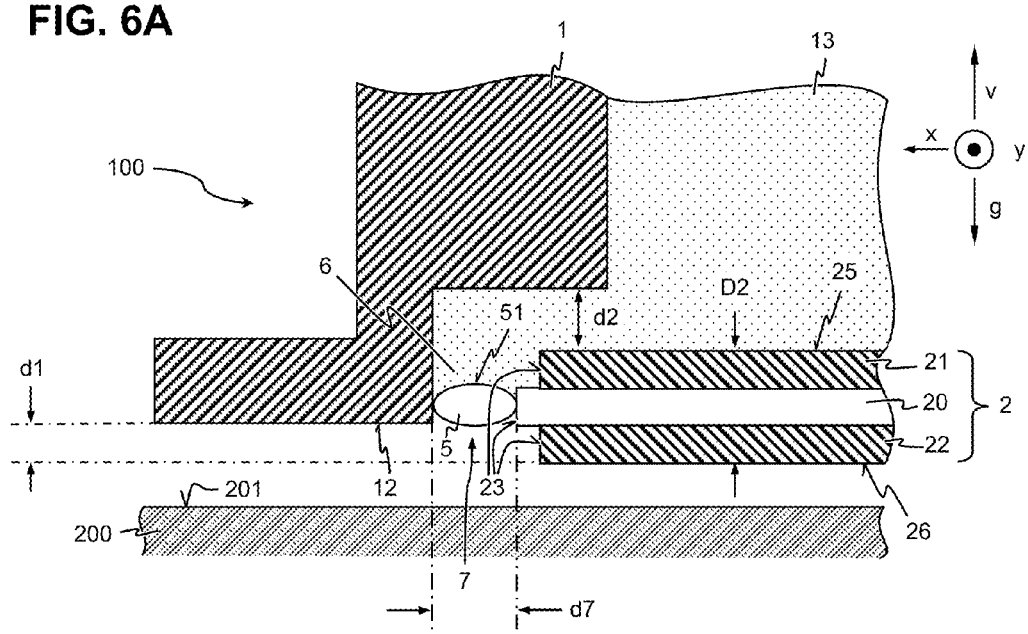
FIG. 6A is a vertical section through a portion of a power semiconductor module in accordance with the first variant in which the substrate is bonded to the module housing by means of a resilient bonding agent and in which a portion of the sidewall of the module housing extends beyond the top edge of the substrate.

Referring now to FIG. 6A, there is illustrated a vertical section through a portion of a power semiconductor module 100 comprising a substrate 2 which may be structured the same and populated with resilient bonding agent 5 as the substrate 2 already detailed in the previous embodiments. The substrate 2, in its resting position, is inserted into an opening configured at bottom side 12 of the module housing 1 and extending in every direction perpendicular to the vertical direction v of which, for example, the lateral direction x, y is greater sized than the lateral direction of the substrate 2 in this lateral direction x, y. This results in a gap 7 having a minimum width d7 between the module housing 1 and substrate 2 in the corresponding lateral direction x, y. The minimum width d7 can range, for example, from 0.1 to 2 mm or 0.1 to 1 mm. This gap 7 is sealed on all sides of the substrate 2 by a resilient bonding agent 5 extending full length from the module housing 1 to the substrate 2 to prevent weeping of a pliant potting compound 13 packed into the interior of the module housing through the gap 7.

Fabricating this assembly includes positioning the substrate 2 in the opening at the bottom side 12 of the module housing 1 so that a gap 7 materializes as described above, after which the gap 7 is closed off by means of a bonding agent 5, e.g., a silicone adhesive. Once the adhesive has cured, at least in part, the bonding agent 5 is resilient.

Provided at the top side 51 of the resilient bonding agent 5 facing away from the bottom side 12 in the vertical direction v is a portion 6 which is free of any part of the module housing 1. Due to the low viscosity of the pliant potting compound 13, any seepage thereof into this portion 6 has no significant effect in obstructing the movement of the module housing 1 in relation to the substrate 2 in the vertical direction v.

In this configuration, a portion of the sidewall of the module housing 1 extends beyond the top side 25 of the substrate 2. In the assembly as shown in FIG. 6A, the power semiconductor module 100 is arranged so that its bottom side 12 and the bottom side 26 of the module housing 1 and substrate 2 respectively face downwards, i.e., in the direction g of the force of gravity. The substrate 2 is in its resting position in which it exhibits in the vertical direction v from the sidewall of the module housing 1 a minimum distance d2 which may be, for example, greater or equal to the thickness of the substrate 2 and/or at least 0.1 greater than the thickness D2 of the substrate 2. This results in the force with which the module housing 1 is pressed into contact against the contact flat 201 of the heat sink 200 is not, or at least not significantly, relayed to the substrate 2, the pliant potting compound 13 relaying near to no force at all because of its very low viscosity. The gap 7 surrounding the substrate 2 on all sides may comprise a minimum width d7 ranging for example from 0.1 to 2 mm or 0.1 to 1 mm perpendicular to the vertical direction v in every lateral direction x, y.

Figure 6B:
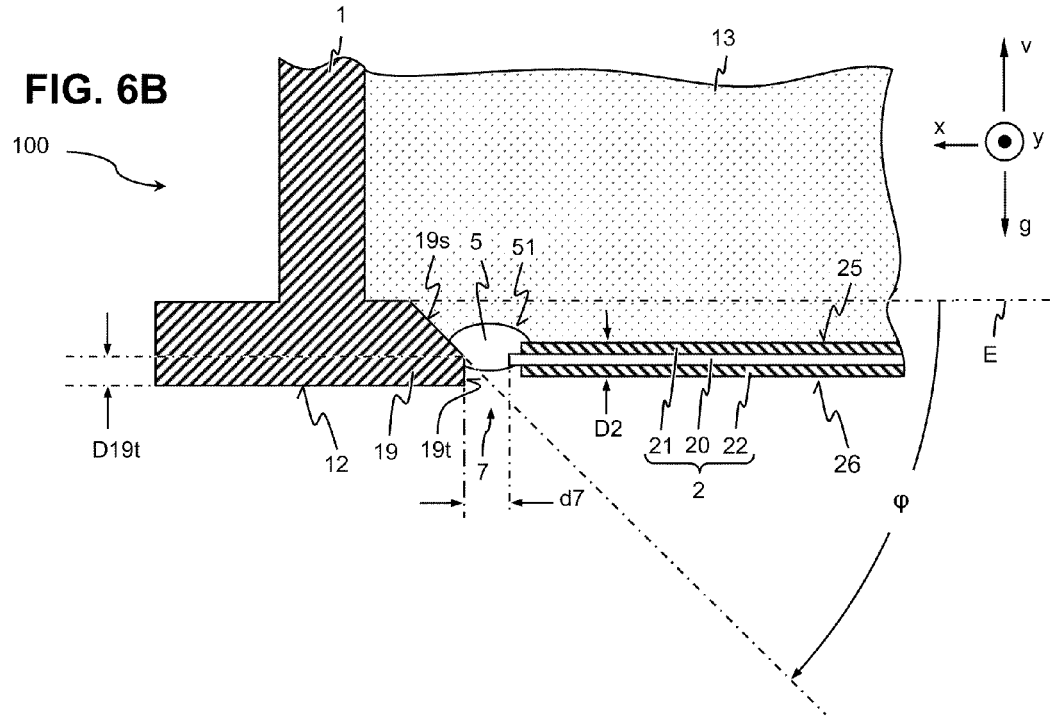
FIG. 6B is a vertical section through a portion of a power semiconductor module in accordance with the second variant in which the bonding agent contacts a slanting surface area of a horizontal web of the module housing.

Referring now to FIG. 6B, there is illustrated a vertical section through a portion of a power semiconductor module 100 the same as the second variant in which the module housing 1 comprises a web 19 extending from the sidewall of the module housing 1 in the direction of the substrate 2. This web 19 comprises at its side facing away from the bottom side 12 of the module housing 1 a first surface portion 19s contacting the resilient bonding agent 5 and including an angle φ greater than 0° by a plane E perpendicular to the vertical direction v. The angle φ may be selected, for example, to range from >0° to ≦60°.

The web 19 comprises in addition at its side facing the substrate 2 an optional second surface portion 19t oriented in the vertical direction v in which it features a dimension D19t>0 mm and may range, for example, from 0.3 to 2 mm.

Figure 6C:
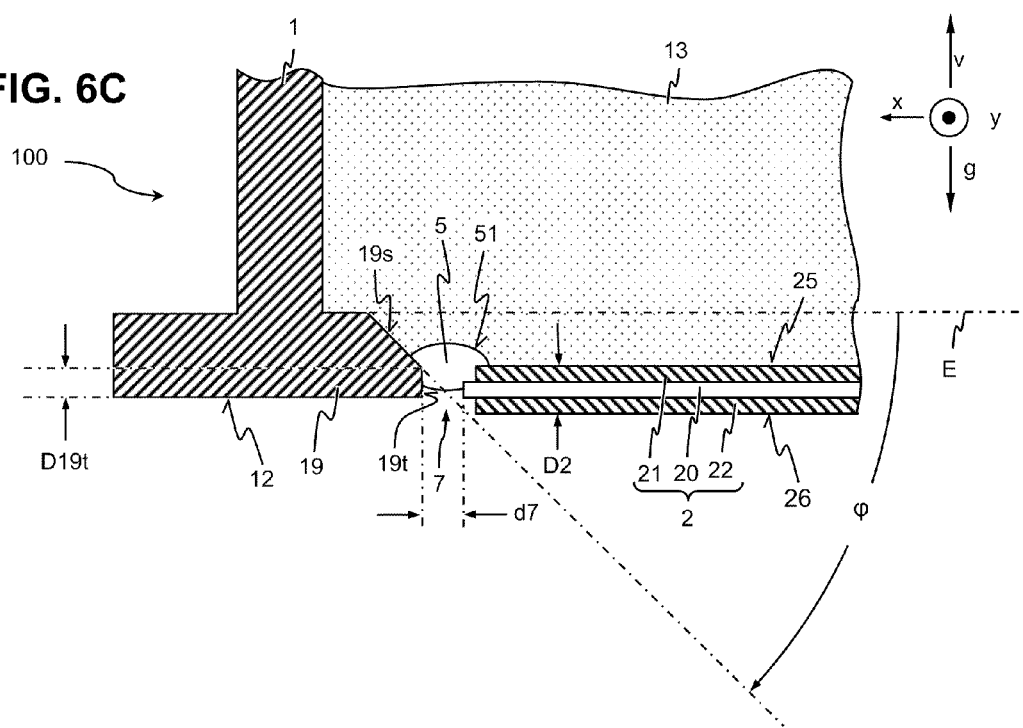
FIG. 6C is a vertical section through a portion of a power semiconductor module in accordance with the first variant in which the bonding agent contacts a slanting surface area of a horizontal web of the module housing.

Referring now to FIG. 6C, there is illustrated an assembly which differs from the assembly as shown in FIG. 6B by the power semiconductor module 100 not corresponding to the second variant but to the first variant. The same as shown in FIG. 6B a web 19 is provided with surface portions 19s and 19t for which the same criterion and dimensions apply as for the surface portions 19s and 19t as already explained in FIG. 6B.

Figure 7A:
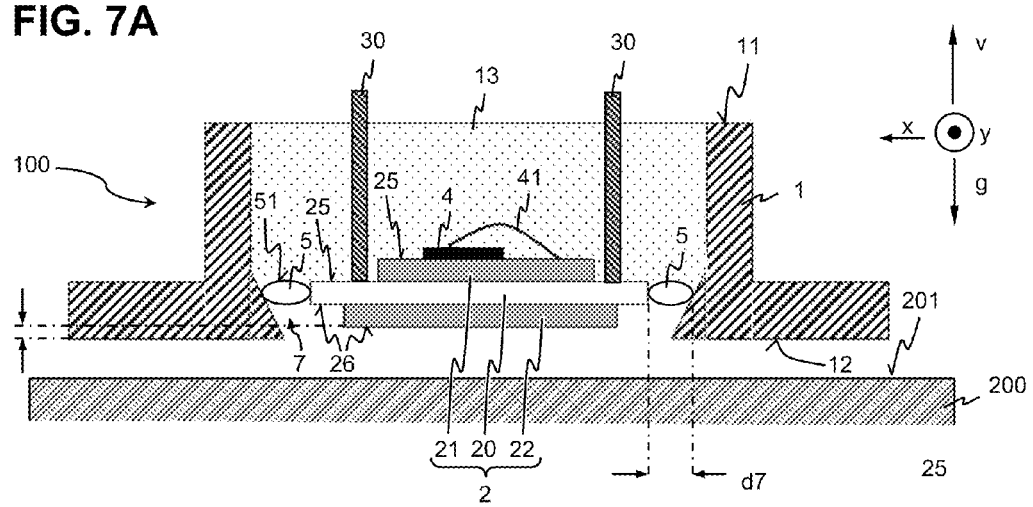
FIG. 7A is a vertical section through a power semiconductor module mountable on a heat sink featuring a substrate resiliently supported vertically in its resting position in which the bottom side of the substrate is sunk in relation to the bottom side of the module housing in accordance with a second variant.

Referring now to FIG. 7A, there is illustrated an assembly that differs from the assembly as shown in FIG. 1A in that the bottom side 26 of the substrate 2 comprises in the resting position thereof and extending in the negative vertical direction v from the bottom side 12 a distance d3 which may range for example from >0 mm to ≦1 mm. This results in the substrate 2 being located slightly recessed in the module housing 1 before mounting. To deflect the substrate 2 in and/or opposite the vertical direction v from its resting position a force ranging from, for example, 0.1 N to 100 N may be necessary.

Thus when locating the module housing 1 on the contact flat 201 of the heat sink no force is applied to the substrate 2, it not being until contact pressure elements 30, which may be configured for example as pressure stamps, become effective that the substrate 2 is pressed out of the module housing 1 into contact with the contact flat 201. In this case, in fabricating the module the substrate 2 may be located recessed in the bottom side of the module housing 1 to be then potted with an adhesive from underneath.

When d3=0 mm, an assembly is achieved according to the third variant in which the bottom side 12 of the substrate 2 and the bottom side 12 of the module housing 1 are coplanar.

Figure 7B:
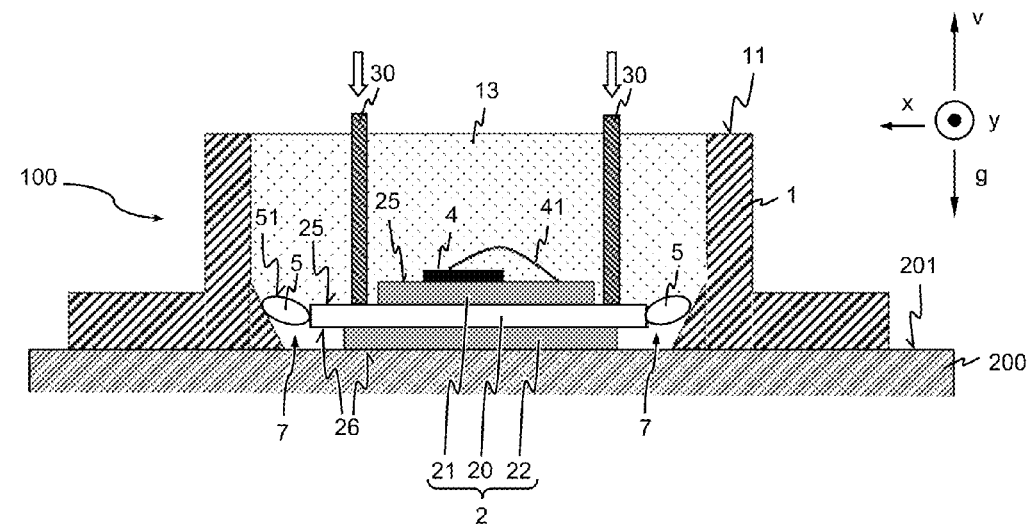
FIG. 7B is a view of the power semiconductor module as shown in FIG. 7A after being mounted on a heat sink.

Referring now to FIG. 7B, there is illustrated the power semiconductor module 100 mounted on the contact flat 201 of the heat sink 200. Here, the contact pressure elements 30 may be optionally formed by electric terminal contacts, e.g., as tabs of the power semiconductor module 100 electrically conductively contacting the top metallization 21 of the substrate 2 and/or the power semiconductor chip 4.

In all of the examples as will now be detailed with reference to the FIGS. 8A, 8B and 9, each of the substrates 2 is bonded in the same way by means of a resilient bonding agent 5 to each module housing 1 the same as the substrate 2 as explained above. The resting position of each substrate 2 may be defined basically optionally in accordance with the first, second or third aspect.

Figure 8A:
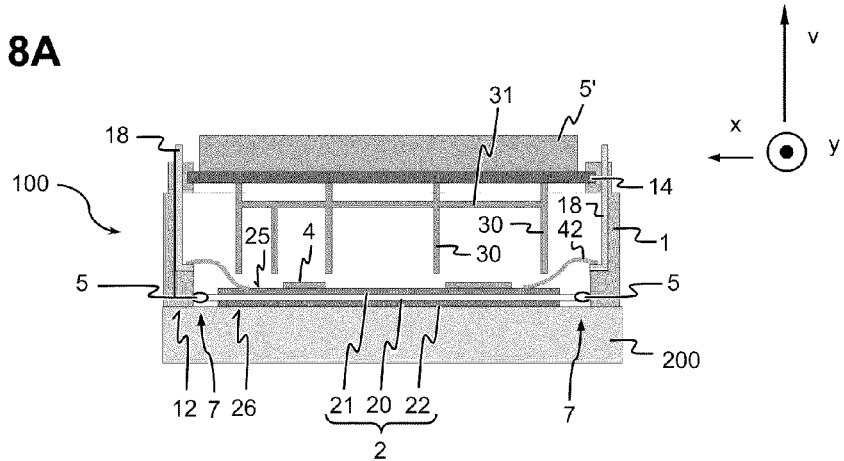
FIG. 8A is a vertical section through a power semiconductor module sited loosely on a heat sink and comprising a cover of the module housing resiliently supported in relation to a frame of the module housing generating by means of a resilient coupling element and a contact pressure device a contact pressure on the substrate in the direction of the heat sink when the module is mounted on a heat sink.

Referring now to FIG. 8A, there is illustrated a cross-section through a power semiconductor module 100 mounted on a heat sink 200 showing how terminal contacts 18 are employed in the sidewall of the module housing 1. As an alternative, the terminal contacts 18 may be injection molded in the sidewall of the module housing 1. Electrically conductively contacting the substrate 2 mounted resilient in relation to the module housing 1 in the vertical direction v to the terminal contacts 18 is done by means of bond wires 42 bonded to the top metallization 21 of the substrate 2 and to the footing of the terminal contacts 18. The bond wires 42 exhibit sufficient freedom of movement to comply with the resiliency of the substrate 2 in relation to the module housing 1 in a vertical direction v without significantly restricting the freedom of movement of the substrate 2 and without risking damage to the bonds of the bond wires 42.

To achieve an even distribution of the contact pressure force experienced by the substrate 2 when bonding the power semiconductor module 100 to the heat sink 200 not only at the side edge of the substrate 2 but also over the surface area of the substrate 2, a cover 14 of the module housing 1 is provided having freedom of movement in the vertical direction v on which a resilient coupling element 5' is arranged, made, for example, of foamed silicone. Disposed between the cover 14 of the module housing 1 and the substrate 2 are several contact pressure elements 30 extending in the vertical direction v which may be optionally interconnected by cross struts 31 oriented perpendicular to the vertical direction v. The contact pressure elements 30 and the cross struts 31 may be configured independent of the cover 14 of the module housing 1 or alternatively in one piece therewith.

To bond the power semiconductor module 100 as shown in FIG. 8A to the heat sink 200 in thereby producing electrically conductively contacting the power semiconductor module 100 to a printed circuit board 300, the latter is firstly located on the resilient coupling element 5' so that the terminal contacts 18 of the power semiconductor module 100 key with corresponding holes 301 in the printed circuit board 300. By means of a pressure plate 119 located on the side of the printed circuit board 300 facing away from the heat sink 200, the power semiconductor module 100 is pressed into contact with the contact flat 201 of the heat sink 200 by joining the pressure plate 119 to the heat sink 200, for example, by screwing them together.

This results in the terminal contacts 18 being urged into the holes 301 of the printed circuit board 300 to electrically conductively contact the substrate 2 via the bond wires 42 and terminal contacts 18 to a circuit realized on the printed circuit board 300.

Since the housing 1 of the power semiconductor module 100 is urged against the heat sink 200 alongside the substrate 2 a sufficiently high contact pressure is assured to reliably press the terminal contacts 18 into the holes 301 of the printed circuit board 300.

Despite this high contact pressure, the pressure of the substrate 2 in the direction of the heat sink 200 is relatively slight because of the decoupling effect of the resilient bonding agents 5 and 5' so that there is no risk of the substrate 2 becoming fractured. A further advantage of arraying the contact pressure elements 30 over the surface area of the substrate 2 is that the force is applied likewise thereover, resulting in it acting not just on the side edge of the substrate 2 in pressing the substrate 2 in the direction of the contact flat 201. This is why there is no significant bending of the substrate 2 when, e.g., a thermal paste injected between the substrate 2 and the contact flat 201 creates a counterpressure aiding compliance of the substrate 2.

The contact pressure elements 30 can apply pressure—as shown—sideways from the power semiconductor chip 4 to the top side 25 of the substrate 2 and/or—as is not shown—to the top side of the power semiconductor chip 4 facing away from the substrate 2.

The side distance d30 of two adjacent contact pressure elements 30 in a direction perpendicular to the vertical direction v may range from 5 to 100 mm, for example. For a substrate 2 having a ceramic dielectric 20 made of an aluminum oxide ceramic ($Al_2O_3$) and 0.25 mm to 0.63 mm thick, a side distance d30 ranging from 10 to 30 mm proved to be practicable.

A contact pressure element 30 can basically be of any shape. In one aspect, it may exhibit the shape of an elongated cylindrical pressure stamp extending in the vertical direction v and having a diameter ranging from 0.5 to 10 mm, it also being possible to be shaped like this but with a rectangular cross-section 0.5 to 100 mm long and 0.5 to 10 mm wide. Likewise, just as possible, the contact pressure element 30 may exhibit, for example, an elliptical or hexagon cross-section.

In accordance with another aspect, a contact pressure element 30 may also be configured as an elongated web 0.5 to 100 mm long and 0.1 to 2 mm wide in a direction perpendicular to the vertical direction v.

Figure 8B:
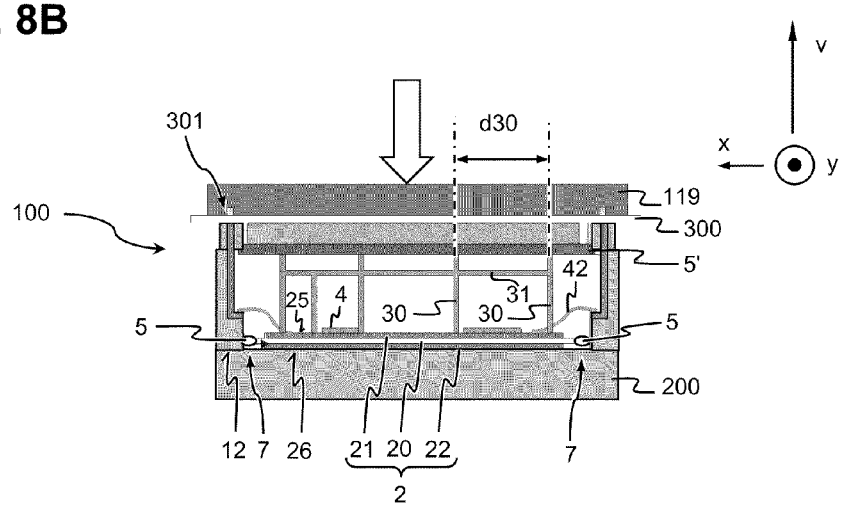
FIG. 8B is a view of the power semiconductor module as shown in FIG. 8A pressed into contact with the heat sink by means of a pressure plate, a printed circuit board being sandwiched between the pressure plate the resilient coupling element having electric contact holes into which press-fit contacts of the power semiconductor module are pressed in mounting the power semiconductor module on the heat sink.
Figure 9:
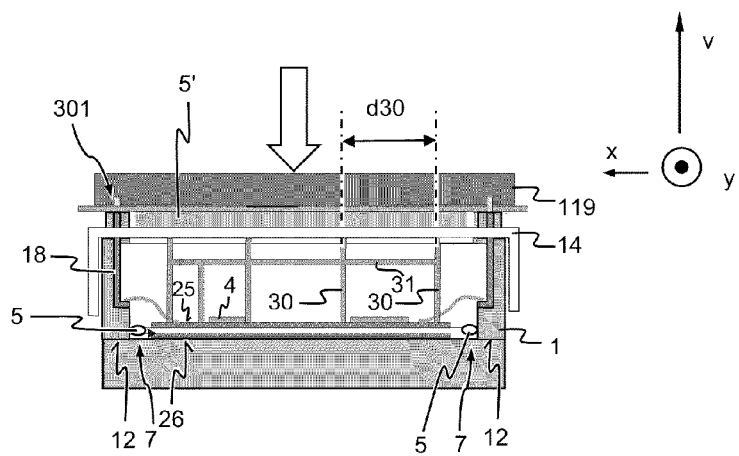
FIG. 9 is a vertical section through an assembly differing from the assembly as shown in FIG. 8B by the cover overhanging a frame of the module housing so that the frame limits freedom of movement of the cover in the direction of the heat sink.

Referring now to FIG. 9, there is illustrated an example different to that as shown in FIG. 8a and in FIG. 8b in that the cover 14 of the module housing 1 overhangs the frame sideways, the frame forming a stop for the cover 14 of the module housing 1 when bonding the power semiconductor module 100 to the heat sink 200.

Figure 10:
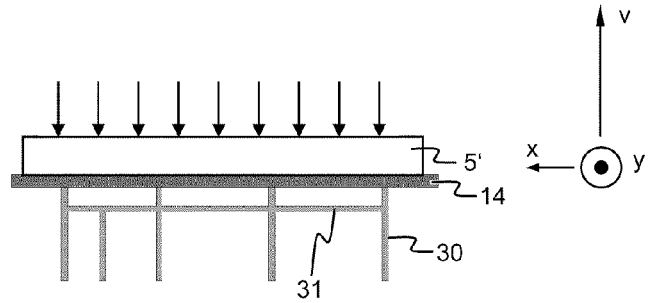
FIG. 10 is a view of an assembly including a cover of the module housing, a resilient coupling element and a contact pressure device for a power semiconductor module in which the resilient coupling element is arranged at the side of the cover of the module housing facing away from the contact pressure device.

Referring now to FIG. 10, there is illustrated an aspect in which a resilient coupling element 5' is arranged on the side of the cover 14 of the module housing 1 facing away from the interior of the module housing 1. The contact pressure elements 30 are sited on the side of the cover 14 of the module housing 1 facing away from the resilient coupling element 5'. The cover 14 of the module housing, the combination of the contact pressure elements 30 joined by cross struts 31 and the coupling element 5' are discrete parts.

Figure 11:
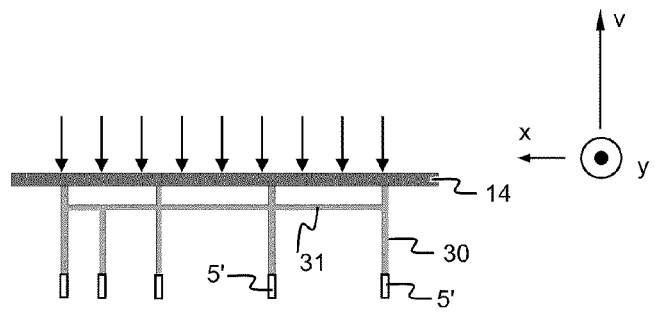
FIG. 11 is a view of an assembly including a cover of the module housing, several resilient coupling elements and a contact pressure device for a power semiconductor module, the contact pressure device featuring several contact pressure elements interconnected by cross-struts, each end of which facing away from the cover of the module housing mounts one of the resilient coupling elements.

Referring now to FIG. 11, there is illustrated an aspect in which each contact pressure element 30 features at its end facing the substrate a resilient coupling element 5'. Here, the cover 14 of the module housing 1 and the combination of the contact pressure elements 30 joined by the cross struts 31 are discrete parts.

Figure 12:
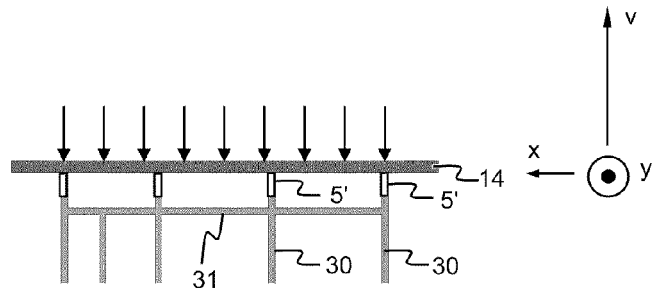
FIG. 12 is a view of an assembly including a cover of the module housing, several resilient coupling elements and a contact pressure device for a power semiconductor module, the contact pressure device featuring several contact pressure elements interconnected by cross-struts, each end of which facing the cover of the module housing mounts one of the resilient coupling elements.

Referring now to FIG. 12, there is illustrated how the aspect shown therein differs from the aspect as shown in FIG. 11 by the resilient coupling element 5' no longer being arranged at the end of the contact pressure elements 30 facing the substrate but at the end facing the cover 14 of the module housing 1.

Figure 13:
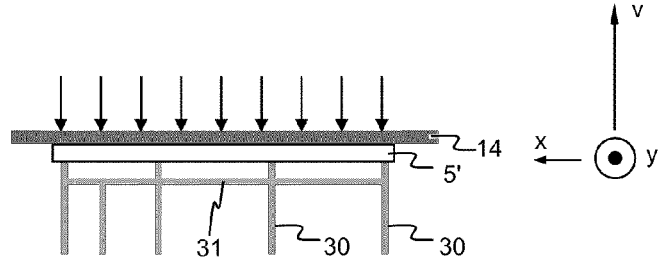
FIG. 13 is a view of an assembly including a cover module housing, a resilient coupling element and a contact pressure device for a power semiconductor module, the resilient coupling element being disposed between the contact pressure device and the cover of the module housing.

Referring now to FIG. 13, there is illustrated how this aspect differs by just a single resilient coupling element 5'—instead of a plurality thereof—being arranged full-length between the cover 14 of the module housing 1 and the combination of the contact pressure elements 30 joined by the cross struts 31.

Figure 14:
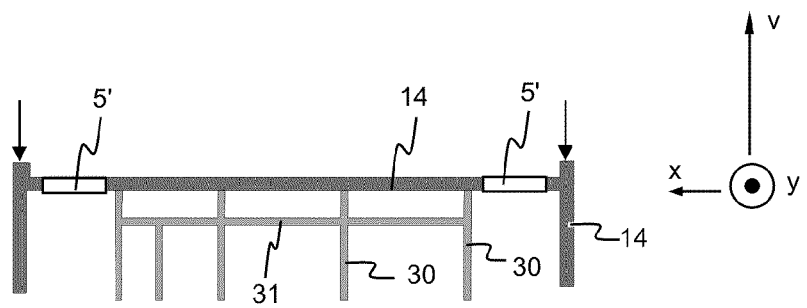
FIG. 14 is a view of an assembly including a cover of the module housing in which resilient coupling elements are integrated so that the sidewalls of the cover of the module housing are decoupled from the contact pressure device by the coupling elements.

Referring now to FIG. 14, there is illustrated an aspect in which resilient coupling elements 5' are integrated in the cover 14 of the module housing 1 so that the sidewalls of the module housing 1 are decoupled by the resilient coupling element 5' relative to the combination of the contact pressure elements 30 joined by the cross struts 31. Here again, the cover 14 of the module housing 1, the resilient coupling element 5' and the combination of the contact pressure elements 30 joined by the cross struts 31 are discrete components.

Figure 15:
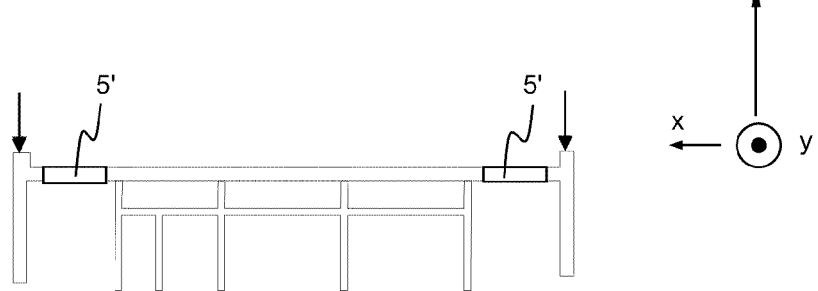
FIG. 15 is a view of an assembly as shown in FIG. 14 except that the cover of the module housing and the contact pressure device are engineered in one piece.

Referring now to FIG. 15, there is illustrated an aspect differing from that as shown in FIG. 14 in that the cover 14 of the module housing 1 and the combination of the contact pressure elements 30 joined by the cross struts 31 are configured in one piece, the resilient coupling element 5' being integrated in the cover 14 of the module housing 1 and may be formed, for example, by a waisting in the cover 14 of the module housing 1.

Figure 16:
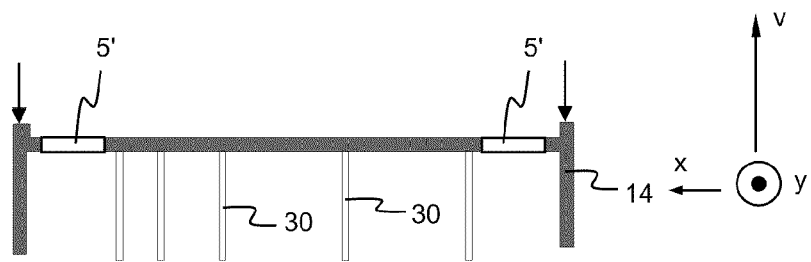
FIG. 16 is a view of an assembly as shown in FIG. 14 except that the contact pressure device comprises discrete contact pressure elements not engineered in one piece with each other.

Referring now to FIG. 16, there is illustrated an aspect which differs from that as shown in FIG. 14 by the contact pressure elements 30 no longer being joined by cross struts 31 but engineered as discrete contact pressure elements 30.

In all of the aspects as explained with reference to FIGS. 10 to 16 regarding a cover 14 of the module housing 1 cooperating with one or more resilient coupling elements 5', the cover 14 of the module housing 1 may be mounted resilient in the vertical direction v relative to a supporting frame of the module housing 1.

Figure 17:
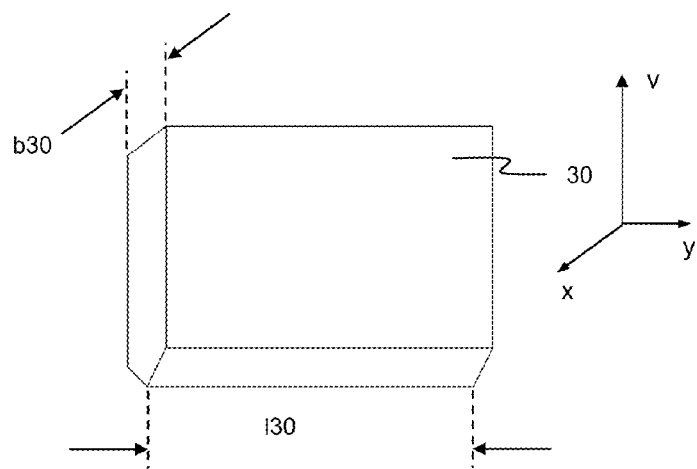
FIG. 17 is a view of a contact pressure element configured as an elongated web.

Referring now to FIG. 17, there is illustrated a contact pressure element 30 configured as an elongated web extending lengthwise perpendicular to the vertical direction v over a length l30 ranging from 0.5 to 100 mm, for example. The width b30 of the contact pressure element 30 may range from, e.g., 0.1 to 2 mm.

Figure 18:
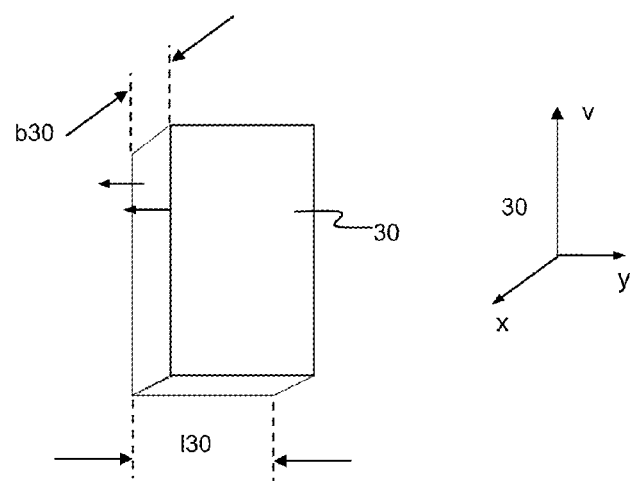
FIG. 18 is a view of an elongated contact pressure element featuring a rectangular cross-section.

Referring now to FIG. 18, there is illustrated a contact pressure element 30 extending in the vertical direction v and featuring a rectangular cross-sectional area with a length l30 and a width b30 perpendicular to the vertical direction v. The length l30 may range, for example, from 0.5 to 100 mm, the width b30 from 0.5 to 10 mm.

Figure 19:
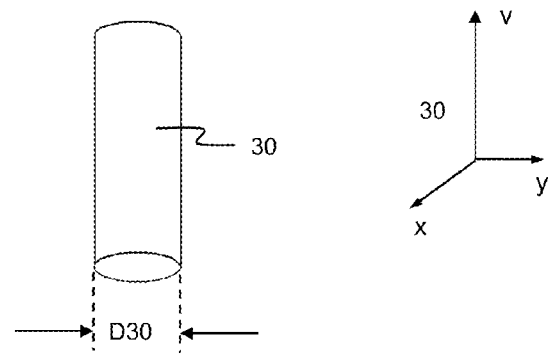
FIG. 19 is a view of a cylindrical contact pressure element.

Referring now to FIG. 19, there is illustrated in conclusion a contact pressure element 30 extending in the vertical direction v and featuring a circular cross-sectional area with a diameter D30 perpendicular to the vertical direction v. The diameter D30 may range for example from 0.5 to 10 mm.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor module mountable on a heat sink, the power semiconductor module comprising a module housing and at least one substrate populated with at least one power semiconductor chip, the module housing comprising a bottom side and a top side spaced away from the bottom side in a positive vertical direction, the substrate comprising a bottom side facing away from an interior of the module housing, and wherein the substrate:
    is arranged in an opening of the module housing, the opening being arranged at the bottom side of the module housing;
    is attached to the module housing by a resilient bonding agent for freedom of movement of the substrate parallel to the vertical direction in relation to the module housing;
    assumes in the non-mounted condition a resting position in relation to the module housing; and
    deflects from the resting position parallel to the vertical direction responsive to a deflection force of 0.1 N to 100 N per mm.

2. The power semiconductor module as set forth in claim 1 wherein the bottom side of the substrate in the resting position comprises in the positive vertical direction a first distance from the bottom side of the module housing so that the bottom side of the substrate is sunk in the positive vertical direction in relation to the bottom side.

3. The power semiconductor module as set forth in claim 2 wherein the first distance ranges from more than 0 mm to 1 mm.

4. The power semiconductor module as set forth in claim 1 wherein the bottom side of the substrate in the resting position comprises in the negative vertical direction a second distance from the bottom side.

5. The power semiconductor module as set forth in claim 4 wherein the second distance ranges from more than 0 mm to 1 mm.

6. The power semiconductor module as set forth in claim 1 wherein the bottom side of the substrate and the bottom side of the module housing in the resting position of the substrate are coplanar.

7. The power semiconductor module as set forth in claim 1 wherein the substrate comprises a lateral surface configured as a closed ring defining the substrate perpendicular to the vertical direction and in which the resilient bonding agent extends from the module housing full length to the lateral surface.

8. The power semiconductor module as set forth in claim 1 wherein in each lateral direction perpendicular to the vertical direction the substrate is spaced away from the module housing by a gap.

9. The power semiconductor module as set forth in claim 8 wherein the gap has a minimum width ranging from 0.1 to 2 mm or from 0.1 to 1 mm.

10. The power semiconductor module as set forth in claim 8 wherein the gap is sealed by the resilient bonding agent.

11. The power semiconductor module as set forth in claim 8 wherein the resilient bonding agent is configured as a bead of an adhesive.

12. The power semiconductor module as set forth in claim 11 wherein the resilient bonding agent is a silicone-based adhesive.

13. The power semiconductor module as set forth in claim 11 wherein the adhesive exhibits a Shore A hardness ranging from 10 to 40.

14. The power semiconductor module as set forth in claim 1 wherein the substrate deflects from the resting position parallel to the vertical direction responsive to a deflection force ranging from 0.1 to 10 N per millimeter.

15. The power semiconductor module as set forth in claim 1 wherein in the resting position the substrate comprises in the vertical direction a minimum distance from a sidewall of the module housing greater than or equal to the thickness of the substrate.

16. The power semiconductor module as set forth in claim 1 wherein in the resting position the substrate comprises in the vertical direction a minimum distance from a sidewall of the module housing greater than the thickness of the substrate by 0.1 mm.

17. The power semiconductor module as set forth in claim 1 wherein the interior of the module housing is potted at least in part by a gel contacting the resilient bonding agent.

18. The power semiconductor module as set forth in claim 17 wherein the gel is a silicone gel.

19. The power semiconductor module as set forth in claim 1 wherein a contact pressure device which, when the power semiconductor module is mounted on a contact flat of the heat sink, presses the substrate in the direction of the heat sink.

20. The power semiconductor module as set forth in claim 1 wherein the module housing comprises a web having a first surface portion including an angle $\phi$ of greater than 0° and smaller than or equal to 60°.

21. The power semiconductor module as set forth in claim 20 wherein the web comprises at a side facing the substrate a second surface portion ranging from 0.3 to 2 mm in the vertical direction.

22. A method for fabricating a power semiconductor module comprising:
providing a module housing comprising a bottom side and a top side spaced away from the bottom side in a positive vertical direction, and an opening configured at the bottom side;
providing a substrate comprising a bottom side, and a top side populated with at least one power semiconductor chip;
positioning the substrate in the opening so that the top side of the substrate faces an interior of the module housing and the substrate is spaced away from the module housing in each direction perpendicular to a vertical direction so that a gap surrounding the substrate materializes between the module housing and the substrate; and
sealing the gap with a resilient bonding agent.

23. The method as set forth in claim 22 wherein the resilient bonding agent is configured as a bead of an adhesive.

24. The method as set forth in claim 22 wherein the substrate is positioned in the opening so that the bottom side of the substrate comprises in a positive vertical direction a first distance from the bottom side of the module housing.

25. The method as set forth in claim 22 wherein the substrate is positioned in the opening so that the bottom side of the substrate comprises in a negative vertical direction a second distance from the bottom side of the module housing.

* * * * *